(12) United States Patent
Anderson et al.

(10) Patent No.: US 7,781,716 B2
(45) Date of Patent: Aug. 24, 2010

(54) STACKED IMAGE SENSOR WITH SHARED DIFFUSION REGIONS IN RESPECTIVE DROPPED PIXEL POSITIONS OF A PIXEL ARRAY

(75) Inventors: Todd J. Anderson, Fairport, NY (US); John P. McCarten, Penfield, NY (US); Joseph R. Summa, Hilton, NY (US); Cristian A. Tivarus, Rochester, NY (US); John T. Compton, LeRoy, NY (US)

(73) Assignee: Eastman Kodak Company, Rochester, NY (US)

( * ) Notice: Subject to any disclaimer, the term of this patent is extended or adjusted under 35 U.S.C. 154(b) by 141 days.

(21) Appl. No.: 12/049,579

(22) Filed: Mar. 17, 2008

(65) Prior Publication Data

US 2009/0230287 A1    Sep. 17, 2009

(51) Int. Cl.
*H01L 27/00* (2006.01)
*H01J 40/14* (2006.01)

(52) U.S. Cl. .................... 250/208.1; 250/214 R

(58) Field of Classification Search ............. 250/208.1, 250/214 R, 239; 257/414, 431, 290–292; 348/272, 281, 294, 302; 438/57, 59, 60, 438/73, 75

See application file for complete search history.

(56) References Cited

U.S. PATENT DOCUMENTS

| | | | |
|---|---|---|---|
| 3,971,065 A | 7/1976 | Bayer | |
| 5,652,621 A | 7/1997 | Adams, Jr. et al. | |
| 5,670,817 A | 9/1997 | Robinson | |
| 6,809,008 B1 | 10/2004 | Holm et al. | |
| 6,927,432 B2 * | 8/2005 | Holm et al. | 257/290 |
| 6,984,816 B2 | 1/2006 | Holm et al. | |
| 7,304,673 B2 | 12/2007 | Erhardt et al. | |
| 7,495,206 B2 * | 2/2009 | Park | 250/214.1 |
| 2006/0118837 A1 * | 6/2006 | Choi | 257/292 |
| 2006/0175536 A1 * | 8/2006 | Kim et al. | 250/208.1 |
| 2007/0018073 A1 | 1/2007 | Hsu et al. | |

(Continued)

FOREIGN PATENT DOCUMENTS

EP    1 453 097    9/2004

(Continued)

OTHER PUBLICATIONS

"Intelligent Image Sensor Chip with Three Dimensional Structure" by H. Kurino et al., Electron Devices Meeting, 1999.

*Primary Examiner*—Que T Le
*Assistant Examiner*—Pascal M Bui-Pho
(74) *Attorney, Agent, or Firm*—Nancy R. Simon

(57) ABSTRACT

A CMOS image sensor or other type of image sensor comprises a sensor wafer and an underlying circuit wafer. The sensor wafer comprises a plurality of photosensitive elements arranged in respective positions of a two-dimensional array of positions in which a subset of the array positions do not include photosensitive elements but instead include diffusion regions each of which is shared by two or more of the photosensitive elements. The sensor wafer is interconnected with the circuit wafer utilizing a plurality of inter-wafer interconnects coupled to respective ones of the shared diffusion regions in respective ones of the array positions that do not include photosensitive elements. The image sensor may be implemented in a digital camera or other type of image capture device.

22 Claims, 11 Drawing Sheets

U.S. PATENT DOCUMENTS

| | | |
|---|---|---|
| 2007/0024931 A1 | 2/2007 | Compton et al. |
| 2007/0030366 A1 | 2/2007 | Compton |
| 2007/0069258 A1 | 3/2007 | Ahn |
| 2007/0210239 A1 | 9/2007 | Lee et al. |
| 2007/0215912 A1* | 9/2007 | Kido et al. .................. 257/257 |
| 2007/0268533 A1 | 11/2007 | Kijima et al. |
| 2008/0018765 A1 | 1/2008 | Choi et al. |
| 2008/0062290 A1 | 3/2008 | Lahav et al. |
| 2008/0083939 A1 | 4/2008 | Guidash |
| 2009/0184349 A1* | 7/2009 | Dungan ...................... 257/292 |

FOREIGN PATENT DOCUMENTS

| | | |
|---|---|---|
| JP | 2001339057 | 12/2001 |
| WO | WO2006/130518 | 12/2006 |
| WO | WO2007/015765 | 2/2007 |
| WO | 2008/117956 | 10/2008 |

* cited by examiner

STACKED IMAGE SENSOR WITH SHARED DIFFUSION REGIONS IN RESPECTIVE DROPPED PIXEL POSITIONS OF A PIXEL ARRAY

FIELD OF THE INVENTION

The present invention relates generally to electronic image sensors for use in digital cameras and other image capture devices, and more particularly to image sensors comprising sensor and circuit wafers arranged in a stack.

BACKGROUND OF THE INVENTION

A typical electronic image sensor comprises a number of light sensitive picture elements ("pixels") arranged in a two-dimensional array. Such an image sensor may be configured to produce a color image by forming a color filter array (CFA) over the pixels. One commonly used type of CFA pattern is the Bayer pattern, disclosed in U.S. Pat. No. 3,971,065, entitled "Color Imaging Array," which is incorporated by reference herein. The Bayer CFA pattern provides each pixel with color photoresponse exhibiting a predominant sensitivity to one of three designated portions of the visible spectrum. The three designated portions may be, for example, red, green and blue, or cyan, magenta and yellow. A given CFA pattern is generally characterized by a minimal repeating unit in the form of a subarray of contiguous pixels that acts as a basic building block for the pattern. Multiple copies of the minimal repeating unit are juxtaposed to form the complete pattern.

An image captured using an image sensor with a Bayer CFA pattern has only one color value at each pixel. Therefore, in order to produce a full color image, the missing color values at each pixel are interpolated from the color values of nearby pixels. Numerous such interpolation techniques are known in the art. See, for example, U.S. Pat. No. 5,652,621, entitled "Adaptive Color Plane Interpolation in Single Sensor Color Electronic Camera," which is incorporated by reference herein.

It is known to form a given image sensor as a so-called stacked image sensor. In a typical arrangement of this type, photodiodes or other photosensitive elements of the pixel array are formed in a first semiconductor die or layer, while associated circuitry for processing signals from the photosensitive elements is formed in a second semiconductor die or layer that underlies the first semiconductor die or layer. These first and second semiconductor die or layers are examples of what are more generally referred to herein as sensor and circuit wafers, respectively.

A problem that arises in conventional stacked image sensors relates to the manner in which the photosensitive elements in the sensor wafer are interconnected with the associated circuitry in the circuit wafer. The typical conventional approach generally calls for such interconnects to be formed on a per-pixel basis, that is, with a separate inter-wafer interconnect provided for each pixel. It is clear that such an approach can significantly increase the cost and complexity of the stacked image sensor. It can also have a negative impact on sensor performance.

Accordingly, a need exists for an improved stacked image sensor which overcomes the above-noted drawbacks of conventional practice.

SUMMARY OF THE INVENTION

Illustrative embodiments of the invention provide stacked image sensors in which shared diffusion regions are arranged in designated array positions that would normally include photosensitive elements. The techniques of the invention generally involve dropping the photosensitive elements from these designated array positions and instead utilizing the positions to facilitate the formation of diffusion regions that are shared by multiple photosensitive elements in adjacent positions of the array.

In accordance with one aspect of the invention, an image sensor comprises a sensor wafer and an underlying circuit wafer. The sensor wafer comprises a plurality of photodiodes or other photosensitive elements arranged in respective positions of a two-dimensional array of positions in which a subset of the array positions do not include photosensitive elements but instead include diffusion regions each of which is shared by two or more of the photosensitive elements. The diffusion regions may be, for example, floating diffusion regions. The sensor wafer is interconnected with the circuit wafer utilizing a plurality of inter-wafer interconnects coupled to respective ones of the shared diffusion regions in respective ones of the array positions that do not include photosensitive elements.

The two-dimensional array may comprise repeating groups of multiple positions with a given such group comprising a plurality of positions that include photosensitive elements arranged around a central dropped pixel position that does not include a photosensitive element. A given one of the shared diffusion regions is arranged in the central position of the given group and is shared by the photosensitive elements in at least a subset of the positions arranged around that central position. Each of the photosensitive elements that shares a given one of the shared diffusion regions may be coupled to that shared diffusion region via a corresponding transfer gate of the sensor wafer.

In one of the illustrative embodiment, the array of positions comprises a rectangular array of rows and columns of positions. For example, the given group may comprise four positions that include photosensitive elements and are arranged around a single central dropped pixel position that does not include a photosensitive element but instead includes one of the shared diffusion regions. The photosensitive elements in the four positions that include photosensitive elements may be panchromatic elements in accordance with a CFA pattern of the image sensor, or may comprise same-color pairs of two different colors of the CFA pattern. As another example, the given group may comprise six positions that include photosensitive elements and are arranged around a single central dropped pixel position that does not include a photosensitive element but instead includes one of the shared diffusion regions.

Other embodiments of the invention need not include rectangular arrays but may instead include arrays in other shapes, such as hexagonal arrays. For example, the given group referred to above in the case of a hexagonal array may also comprise six positions that include photosensitive elements and are arranged around a single central dropped pixel position that does not include a photosensitive element but instead includes one of the shared diffusion regions. However, in this case, the photosensitive elements in two adjacent ones of the six positions that include photosensitive elements are same-color elements, while the remaining ones of the six positions are panchromatic elements.

An image sensor in accordance with the invention may be advantageously implemented in a digital camera or other type of image capture device. The techniques disclosed herein considerably facilitate the manufacture of stacked image sensors, at reduced cost and complexity, particularly for those image sensors having sparse CFA patterns.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIGS. 6 through 9B show other examples of pixel arrays with shared diffusion regions and associated inter-wafer interconnects in illustrative embodiments of the invention.

DETAILED DESCRIPTION OF THE INVENTION

The present invention will be illustrated herein in conjunction with particular embodiments of image capture devices and image sensors. It should be understood, however, that these illustrative arrangements are presented by way of example only, and should not be viewed as limiting the scope of the invention in any way. Those skilled in the art will recognize that the disclosed arrangements can be adapted in a straightforward manner for use with a wide variety of other types of image capture devices and image sensors.

Figure 1:
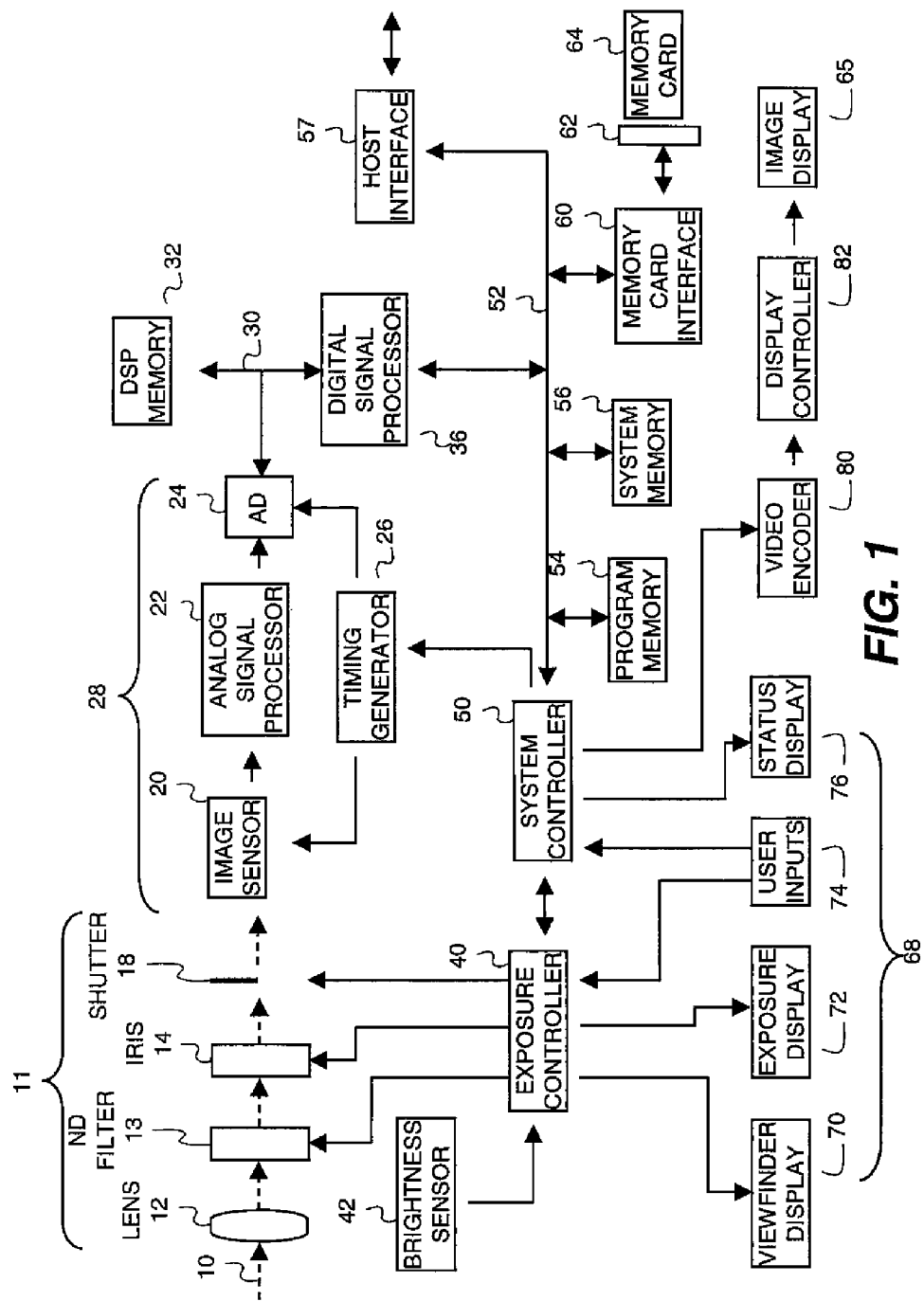
FIG. 1 is a block diagram of a digital camera having a stacked image sensor with a sparse CFA pattern and incorporating shared diffusion regions and associated inter-wafer interconnects in accordance with an illustrative embodiment of the invention.

FIG. 1 shows a digital camera in which an image sensor having shared inter-wafer interconnects is implemented in an illustrative embodiment of the invention. In the digital camera, light 10 from a subject scene is input to an imaging stage 11. The imaging stage 11 comprises lens 12, neutral density (ND) filter 13, iris 14 and shutter 18. The light 10 is focused by lens 12 to form an image on an image sensor 20. The amount of light reaching the image sensor 20 is regulated by iris 14, ND filter 13 and the time that shutter 18 is open. Image sensor 20 converts the incident light to an electrical signal for each pixel. The image sensor 20 may be, for example, a charge coupled device (CCD) type or active pixel sensor (APS) type image sensor, although other types of image sensors may be used in implementing the invention. APS type image sensors fabricated using a complementary metal-oxide-semiconductor (CMOS) process are often referred to as CMOS image sensors.

The image sensor 20 generally has a two-dimensional array of pixels configured in accordance with a designated CFA pattern. Examples of CFA patterns that may be used with the image sensor 20 include the panchromatic checkerboard patterns disclosed in U.S. Patent Application Publication No. 2007/0024931, entitled "Image Sensor with Improved Light Sensitivity," which is incorporated by reference herein. These panchromatic checkerboard patterns provide certain of the pixels with a panchromatic photoresponse, and are also generally referred to herein as "sparse" CFA patterns. A panchromatic photoresponse has a wider spectral sensitivity than those spectral sensitivities represented in the selected set of color photoresponses and may, for example, have high sensitivity across substantially the entire visible spectrum. Image sensors configured with panchromatic checkerboard CFA patterns exhibit greater light sensitivity and are thus well-suited for use in applications involving low scene lighting, short exposure time, small aperture, or other restrictions on the amount of light reaching the image sensor. Other types of CFA patterns may be used in other embodiments of the invention.

An analog signal from image sensor 20 is processed by analog signal processor 22 and applied to analog to digital (A/D) converter 24. Timing generator 26 produces various clocking signals to select particular rows and columns of the pixel array for processing, and synchronizes the operation of analog signal processor 22 and A/D converter 24. The image sensor 20, analog signal processor 22, A/D converter 24, and timing generator 26 collectively form an image sensor stage 28 of the digital camera. The components of image sensor stage 28 may comprise separately fabricated integrated circuits, or they may be fabricated as a single integrated circuit as is commonly done with CMOS image sensors. The A/D converter 24 outputs a stream of digital pixel values that are supplied via a bus 30 to a memory 32 associated with a digital signal processor (DSP) 36. Memory 32 may comprise any type of memory, such as, for example, synchronous dynamic random access memory (SDRAM). The bus 30 provides a pathway for address and data signals and connects DSP 36 to memory 32 and A/D converter 24.

The DSP 36 is one of a plurality of processing elements of the digital camera that are indicated as collectively comprising a processing stage 38. The other processing elements of the processing stage 38 include exposure controller 40 and system controller 50. Although this partitioning of digital camera functional control among multiple processing elements is typical, these elements may be combined in various ways without affecting the functional operation of the camera and the application of the present invention. A given one of the processing elements of processing stage 38 can comprise one or more DSP devices, microcontrollers, programmable logic devices, or other digital logic circuits. Although a combination of three separate processing elements is shown in the figure, alternative embodiments may combine the functionality of two or more of these elements into a single processor, controller or other processing element. Techniques for sampling and readout of the pixel array of the image sensor 20 may be implemented at least in part in the form of software that is executed by one or more such processing elements.

The exposure controller 40 is responsive to an indication of an amount of light available in the scene, as determined by brightness sensor 42, and provides appropriate control signals to the ND filter 13, iris 14 and shutter 18 of the imaging stage 11.

The system controller 50 is coupled via a bus 52 to DSP 36 and to program memory 54, system memory 56, host interface 57 and memory card interface 60. The system controller 50 controls the overall operation of the digital camera based on one or more software programs stored in program memory 54, which may comprise Flash electrically erasable programmable read-only memory (EEPROM) or other nonvolatile memory. This memory is also used to store image sensor calibration data, user setting selections and other data which must be preserved when the camera is turned off. System controller 50 controls the sequence of image capture by directing exposure controller 40 to operate the lens 12, ND filter 13, iris 14, and shutter 18 as previously described, directing the timing generator 26 to operate the image sensor 20 and associated elements, and directing DSP 36 to process the captured image data.

In the illustrated embodiment, DSP 36 manipulates the digital image data in its memory 32 according to one or more software programs stored in program memory 54 and copied to memory 32 for execution during image capture. After an image is captured and processed, the resulting image file stored in memory 32 may be, for example, transferred via host interface 57 to an external host computer, transferred via memory card interface 60 and memory card socket 62 to removable memory card 64, or displayed for the user on an image display 65. The image display 65 is typically an active matrix color liquid crystal display (LCD), although other types of displays may be used.

The digital camera further comprises a user control and status interface 68 including a viewfinder display 70, an exposure display 72, user inputs 74 and status display 76. These elements may be controlled by a combination of software programs executed on exposure controller 40 and system controller 50. The user inputs 74 typically include some combination of buttons, rocker switches, joysticks, rotary dials or touchscreens. Exposure controller 40 operates light metering, exposure mode, autofocus and other exposure functions. The system controller 50 manages a graphical user interface (GUI) presented on one or more of the displays, e.g., on image display 65. The GUI typically includes menus for making various option selections and review modes for examining captured images.

Processed images may be copied to a display buffer in system memory 56 and continuously read out via video encoder 80 to produce a video signal. This signal may be output directly from the camera for display on an external monitor, or processed by display controller 82 and presented on image display 65.

It is to be appreciated that the digital camera as shown in FIG. 1 may comprise additional or alternative elements of a type known to those skilled in the art. Elements not specifically shown or described herein may be selected from those known in the art. As noted previously, the present invention may be implemented in a wide variety of other types of digital cameras or image capture devices. For example, the present invention can be implemented in imaging applications involving mobile phones and automotive vehicles. Also, as mentioned above, certain aspects of the embodiments described herein may be implemented at least in part in the form of software executed by one or more processing elements of an image capture device. Such software can be implemented in a straightforward manner given the teachings provided herein, as will be appreciated by those skilled in the art.

The two-dimensional pixel array of image sensor 20 comprises an array of light sensitive pixels, fabricated using stacked sensor and circuit wafers, that provide a way of converting incoming light at each pixel into an electrical signal that is measured. As the sensor is exposed to light, free carriers are generated and captured within the photosensitive element at each pixel. Capturing these free carriers for some period of time and then measuring the number of carriers captured, or measuring the rate at which free carriers are generated, allows the light level at each pixel to be measured. In the former case, accumulated carriers may be shifted out of a given photosensitive element and onto an input node of a charge to voltage measurement circuit as in a CMOS image sensor.

Sampling and readout circuitry in a given embodiment may encompass switches or other elements that are formed integrally with the pixel array. Such sampling and readout circuitry is generally implemented within the sensor array 20, for example, as in the case of a CMOS image sensor.

Whenever general reference is made to an image sensor in the following description, it is understood to be representative of the image sensor 20 from FIG. 1. It is further understood that all examples and their equivalents of image sensor architectures and pixel patterns of the present invention disclosed in this specification are used for image sensor 20.

In the context of an image sensor, a pixel may refer to a discrete light sensing area and charge shifting or charge measurement circuitry associated with the light sensing area. In the context of a digital color image, the term pixel commonly refers to a particular location in the image having associated color values.

Figure 2:
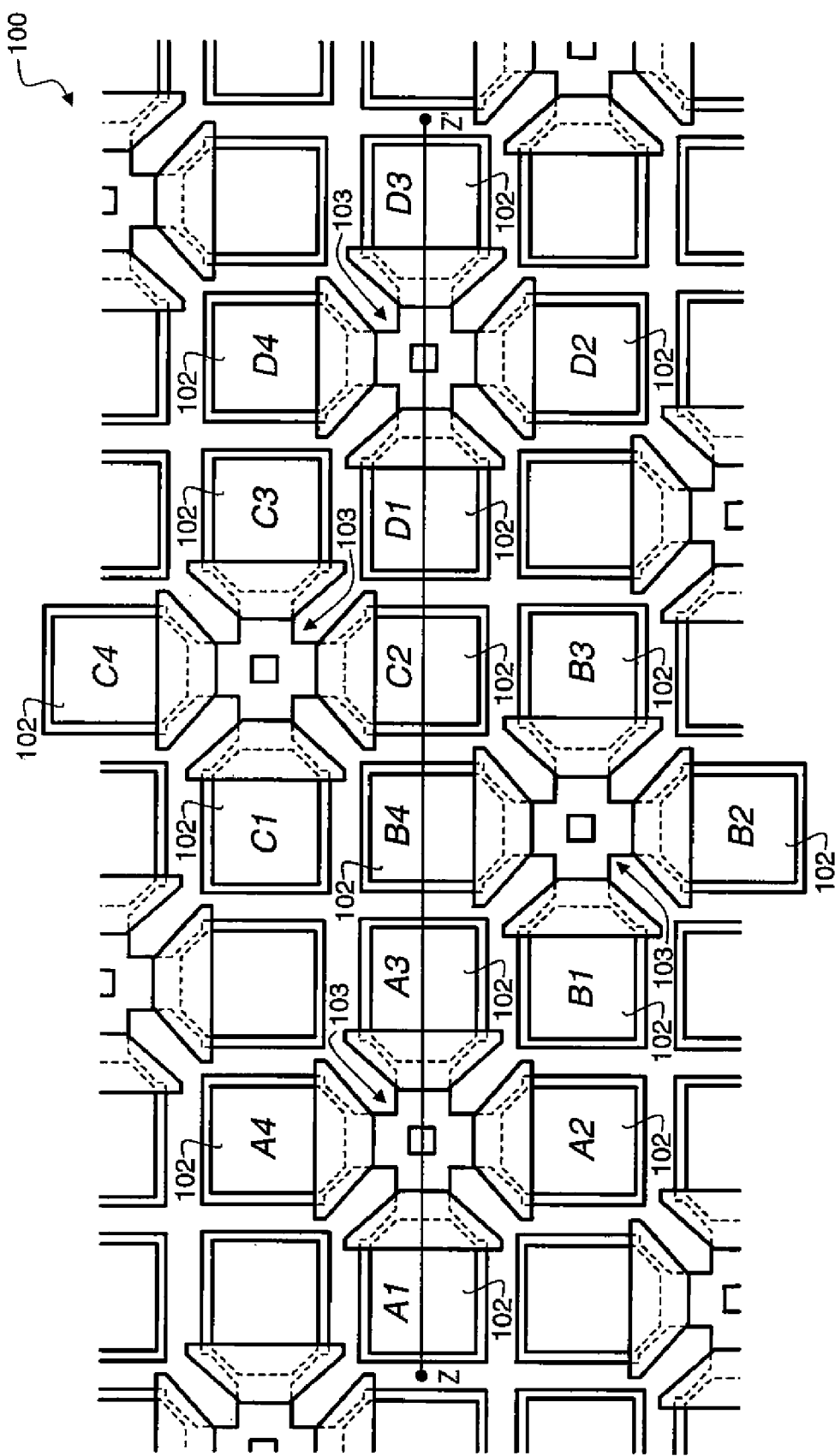
FIG. 2 is a plan view showing a portion of a pixel array in the image sensor of the digital camera of FIG. 1.

FIG. 2 shows a portion of a pixel array 100 in the image sensor 20 of the digital camera of FIG. 1 in an illustrative embodiment. It should be noted that the CFA pattern is omitted from this plan view for clarity. Generally, the view shown is looking down on the upper surface of the sensor in the same direction in which the light 10 from the subject scene would be incident on that surface. It is assumed that the sensor is a stacked image sensor having a sensor wafer overlying a circuit wafer. The view of FIG. 2 therefore shows the upper surface of the sensor wafer. It can be seen that the sensor wafer comprises a plurality of photodiodes 102 arranged in respective positions of the two-dimensional array. However, certain positions of the array that would also normally include photodiodes in a conventional implementation do not include such elements in the present embodiment. Instead, these positions are utilized for shared diffusion regions 103 that are shared by multiple photodiodes in adjacent positions of the array. The array positions utilized for the shared diffusion regions 103 in this embodiment are examples of what are generally referred to herein as "dropped pixel" positions, as the corresponding pixel locations in the array do not include photodiodes.

The particular sharing arrangement in the FIG. 2 embodiment is one in which a given diffusion region 103 is shared by four of the photodiodes 102. For example, one of the diffusion regions 103 is shared by four photodiodes denoted A1, A2, A3 and A4. These four photodiodes occupy array positions adjacent to the array position that includes the corresponding shared diffusion region. Similarly, the four photodiodes B1, B2, B3 and B4 share a common diffusion region, as do the four photodiodes C1, C2, C3 and C4, and the four photodiodes D1, D2, D3 and D4. This sharing arrangement is repeated with other sets of four photodiodes throughout the pixel array.

Thus, it is apparent that the pixel array 100 of FIG. 2 comprises repeating groups of multiple array positions with a given such group comprising multiple positions that include respective photodiodes 102 and are arranged around a central position that does not include a photodiode but is instead utilized for a diffusion region 103 shared by the surrounding photodiodes. Each of the photodiodes that shares a given diffusion region 103 is coupled thereto via a corresponding transfer gate of the sensor wafer, as can be seen more clearly in FIGS. 3 and 4. Although four photodiodes share a diffusion region in the FIG. 2 arrangement, other embodiments of the invention may utilize different sharing arrangements. Examples of arrangements in which six photodiodes share a given diffusion region and associated inter-wafer interconnect will be described below with reference to FIGS. 5, 6 and 7. Other examples with different sharing arrangements will be described with reference to FIGS. 8 and 9.

Figure 3:
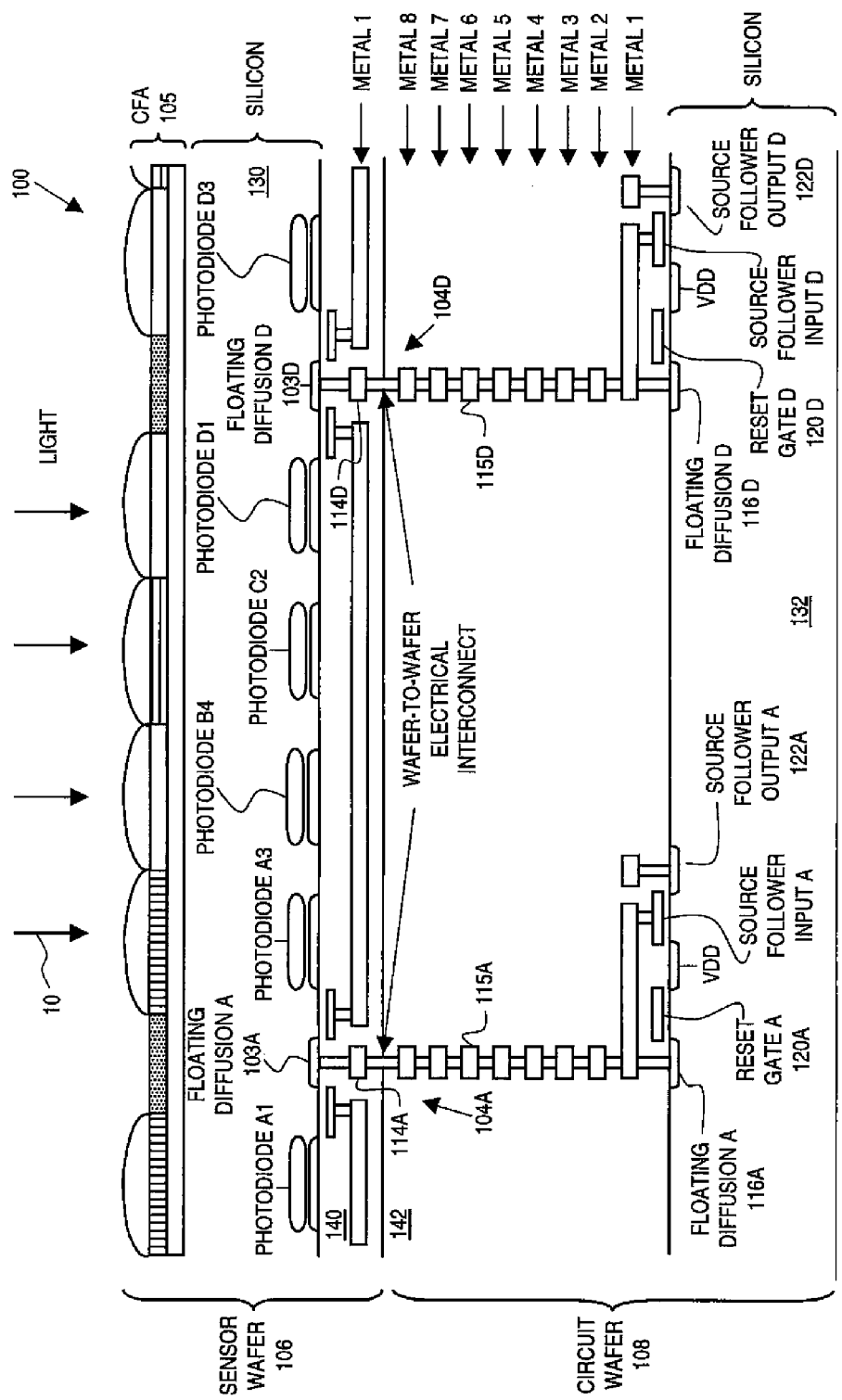
FIG. 3 is a cross-sectional view of the portion of the pixel array of FIG. 2 illustrating shared diffusion regions and associated inter-wafer interconnects.
Figure 4:
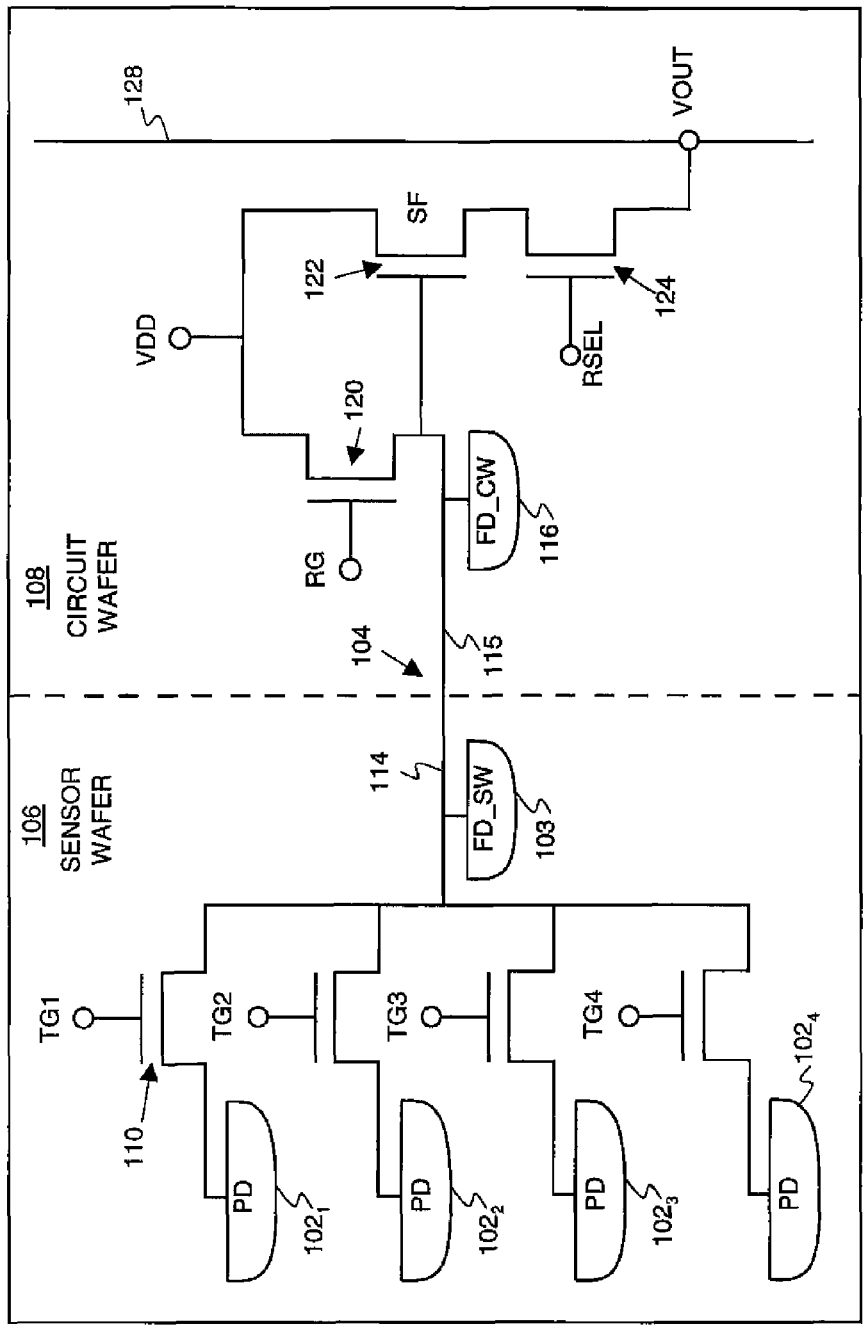
FIG. 4 is a schematic diagram illustrating the manner in which a given diffusion region of the pixel array of FIGS. 2 and 3 is shared by four photodiodes of that array.

Each of the shared floating diffusion regions 103 of the sensor wafer as shown in FIG. 2 is associated with a corresponding inter-wafer interconnect 104 that serves to couple the sensor wafer to the underlying circuit wafer, as can be seen with reference to FIGS. 3 and 4. The shared diffusion regions in the illustrative embodiments are assumed to be floating diffusion regions, but other types of diffusion regions, in any combination, may be used in alternative embodiments A wide variety of diffusion region implementations are well known to those skilled in the art. See, for example, PCT International Publication No. WO 2006/130518, entitled "CMOS Image Sensor Pixel with Selectable Binning," which is incorporated by reference herein.

FIG. 3 shows a cross-sectional view of the pixel array 100 of FIG. 2 along the section line Z-Z' of the latter figure. In this view, it can be seen that CFA pattern 105 is formed on the upper surface of sensor wafer 106, and circuit wafer 108 underlies the sensor wafer 106. Light 10 from the subject scene is filtered by the CFA pattern 105 of the pixel array 100 such that designated portions of the visible spectrum are incident on respective ones of the photodiodes 102. For example, certain photodiodes may receive predominantly red, green or blue light, while others receive panchromatic light, in accordance with the particular CFA pattern that is utilized.

As shown in the schematic diagram of FIG. 4, each of four photodiodes $102_1$, $102_2$, $102_3$ and $102_4$ that share a common diffusion region 103 has an associated transfer gate 110. The diffusion region 103 of the sensor wafer 106 is illustratively a floating diffusion region. The four transfer gates 110, also denoted TG1, TG2, TG3 and TG4, couple the respective photodiodes to the shared diffusion region 103. This floating diffusion region is coupled via metal conductors 114, 115 of interconnect 104 to a corresponding floating diffusion region 116 in the circuit wafer 108. The floating diffusion regions 103, 116 of the sensor and circuit wafers are also denoted FD_SW and FD_CW, respectively. Metal conductors 114, 115 of interconnect 104 are located in the sensor and circuit wafers, respectively.

The floating diffusion region 116 of the circuit wafer 108 is coupled to additional circuitry for processing signals generated by the photodiodes 102. This additional circuitry comprises a reset gate (RG) 120, a source follower (SF) 122, and a row select (RSEL) gate 124. This additional circuitry is coupled between a supply voltage VDD and an output voltage (VOUT) signal line 128. Each of the gates 110, 120, 122 and 124 in this embodiment is implemented as an N-type metal-oxide-semiconductor (NMOS) transistor, although other types of circuitry may be used, such as a P-type metal-oxide-semiconductor (PMOS) transistor. It is apparent from FIG. 4 that the set of additional circuitry comprising gates 120, 122 and 124 of circuit wafer 108 is shared by the four photodiodes $102_1$, $102_2$, $102_3$ and $102_4$ of the sensor wafer 106. The circuit wafer includes a similar set of such circuitry for each of the sets of four photodiodes 102 in the sensor wafer that share a common floating diffusion region 103.

Returning to the cross-sectional view of FIG. 3, the photodiodes A1, A3, B4, C2, D1 and D3 that lie along the section line Z-Z' in FIG. 2 are seen to be formed in silicon portion 130 of the sensor wafer 106. Also formed in this silicon portion of the sensor wafer is the floating diffusion region A, also denoted 103A, which is associated with the four photodiodes A1, A2, A3 and A4, and the floating diffusion region D, also denoted 103D, which is associated with the four photodiodes D1, D2, D3 and D4. It should be noted that the CFA pattern 105 in this embodiment has a black filter element over each of the floating diffusion regions 103A, 103D. For many pixel architectures, such an arrangement serves to improve color uniformity for different pixels of the same color. In other embodiments, the black filter elements may be eliminated, and the adjacent color filter elements extended over the floating diffusion regions 103A, 103D. Corresponding microlenses may be similarly extended. Arrangements of this type advantageously allow the neighboring photodiodes to "steal the light" from the corresponding dropped pixel positions of the pixel array, thereby improving sensitivity.

A silicon portion 132 of the circuit wafer 108 includes corresponding floating diffusion regions A and D, also denoted 116A and 116D, respectively. The floating diffusion region 103A of the sensor wafer 106 is coupled via an interconnect 104A to the corresponding floating diffusion region 116A in the underlying circuit wafer 108. The interconnect 104A comprises metal conductors 114A formed in a metallization portion 140 of the sensor wafer and metal conductors 115A formed in a metallization portion 142 of the circuit wafer.

Similarly, the floating diffusion region 103D of the sensor wafer 106 is coupled via an interconnect 104D to a corresponding floating diffusion region 116D in the underlying circuit wafer 108. The interconnect 104D comprises metal conductors 114D formed in the metallization portion 140 of the sensor wafer 106 and metal conductors 115D formed in the metallization portion 142 of the circuit wafer 108. The metallization portion 140 of the sensor wafer comprises a single metal layer denoted "Metal 1." The metallization portion 142 of the circuit wafer 108 comprises multiple metal layers including layers denoted "metal 1" through "metal 8" as shown. The metal conductors 114, 115 of the inter-wafer interconnects 104 provide wafer-to-wafer electrical interconnection of the sensor and circuit wafers as indicated. It should be noted that the particular multi-layer metal interconnects shown in this example are not requirements of the invention. Numerous other types of inter-wafer interconnects may be used in alternative embodiments.

Also formed in the silicon portion 132 of the circuit wafer 108 are parts of the reset gate 120 and source follower 122 for each of the groups A and D of photodiodes. It should be noted that the row select gate 124 shown in the schematic diagram of FIG. 4 is omitted from the cross-sectional view of FIG. 3 for simplicity and clarity of illustration. Those skilled in the art will be familiar with the manner in which row select gates and other similar elements can be formed in a circuit wafer. In other embodiments, row select gates may be eliminated through the use of appropriate timing sequences that are known in the art.

The dropped pixel positions, that is, the array positions that do not include photodiodes but instead include shared diffusion regions, generally correspond to respective designated elements of the CFA pattern 105.

Figure 5B:
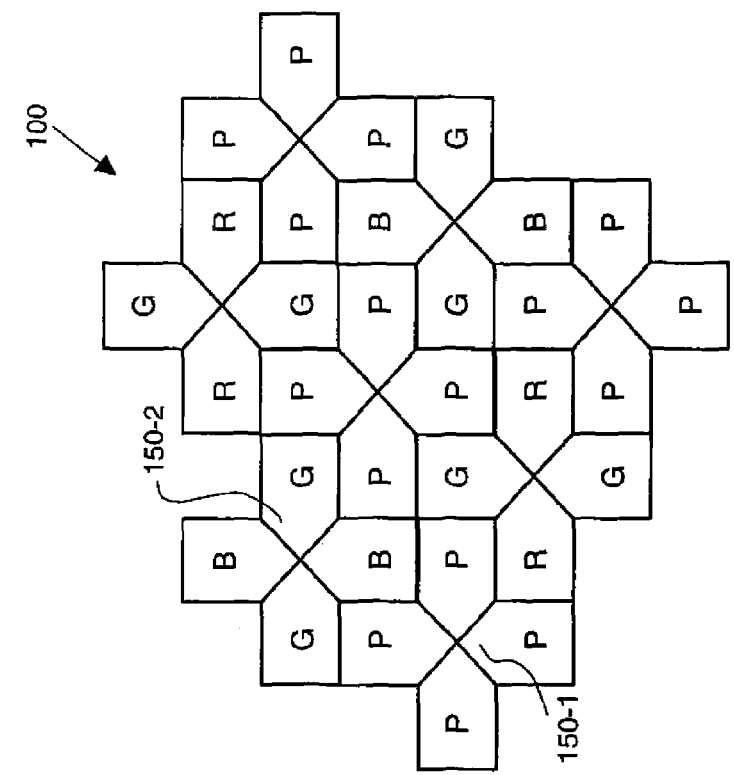
FIGS. 5A and 5B illustrate the manner in which particular dropped pixel positions correspond to respective elements of an exemplary CFA pattern that may be utilized with the pixel array of FIGS. 2 and 3.
Figure 5A:
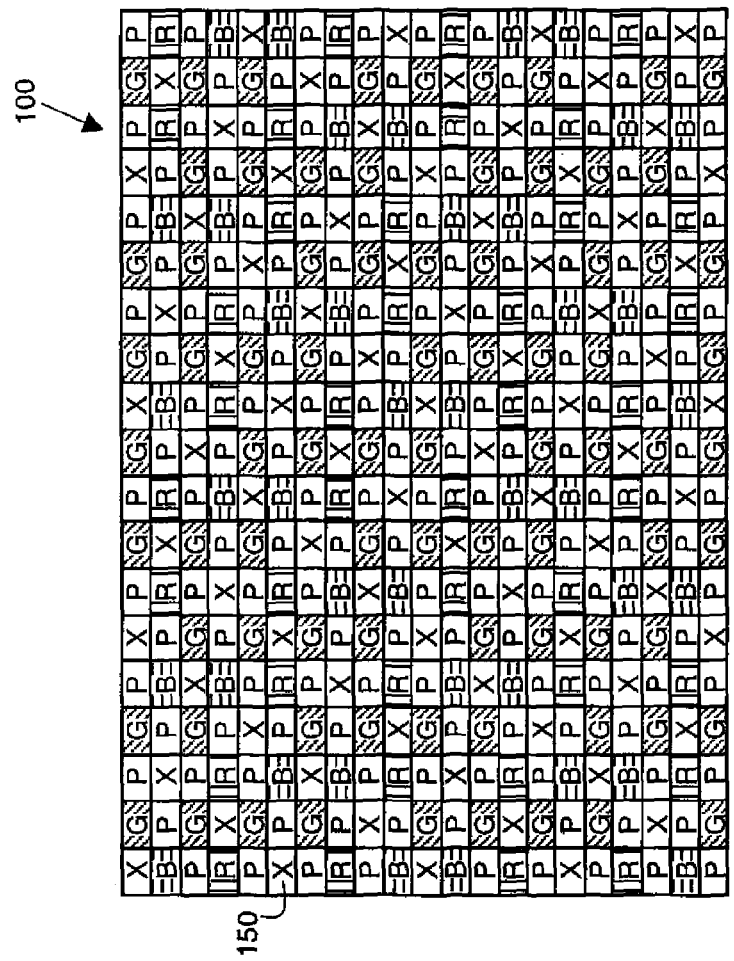

With reference now to FIGS. 5A and 5B, a portion of the array 100 is shown, illustrating one possible implementation of the CFA pattern 105 as modified to include dropped pixel positions in accordance with an embodiment of the present invention. The CFA pattern in this example is a panchromatic checkerboard pattern of a type disclosed in the above-cited U.S. Patent Application Publication No. 2007/0024931. FIG. 5A shows a larger portion of the pixel array 100, while FIG. 5B is a more detailed view of a smaller portion of the array as shown in FIG. 5A. The pixel array 100 as shown in these figures comprises a rectangular array of positions arranged in rows and columns. The array positions that include photodiodes are denoted as either red (R), green (G), blue (B) or panchromatic (P), in accordance with the corresponding elements of the particular CFA pattern 105. The array positions that do not include photodiodes, referred to as the dropped pixel positions of the array, are identified in FIG. 5A by an "x."

As previously described in conjunction with FIGS. 2 through 4, the pixel array 100 implements a four-pixel sharing arrangement in which four of the array positions that include photodiodes are arranged around a single central dropped pixel position, with the dropped pixel position being utilized for a diffusion region shared by the four photodiodes. This exemplary sharing arrangement is more clearly shown in FIG. 5B, where it can be seen that one of the dropped pixel positions 150-1 is associated with four surrounding panchromatic pixels. Another of the dropped pixel positions 150-2 is associated with two pairs of same-color pixels, with the same-color pixels of a given one of the pairs being arranged on opposite sides of that dropped pixel position. More specifically, dropped pixel position 150-2 is associated with a pair of blue pixels and a pair of green pixels. Other groups of array positions in the array 100 are configured in a similar manner, to include either four panchromatic pixels around a dropped pixel position, or two different pairs of same-color pixels arranged around a dropped pixel position.

It is to be appreciated that the particular sparse CFA pattern and pixel sharing arrangement used in the four-shared pixel array 100 as shown in FIG. 5 is exemplary only, and numerous other types of CFA patterns and sharing arrangements may be used.

Figure 6:
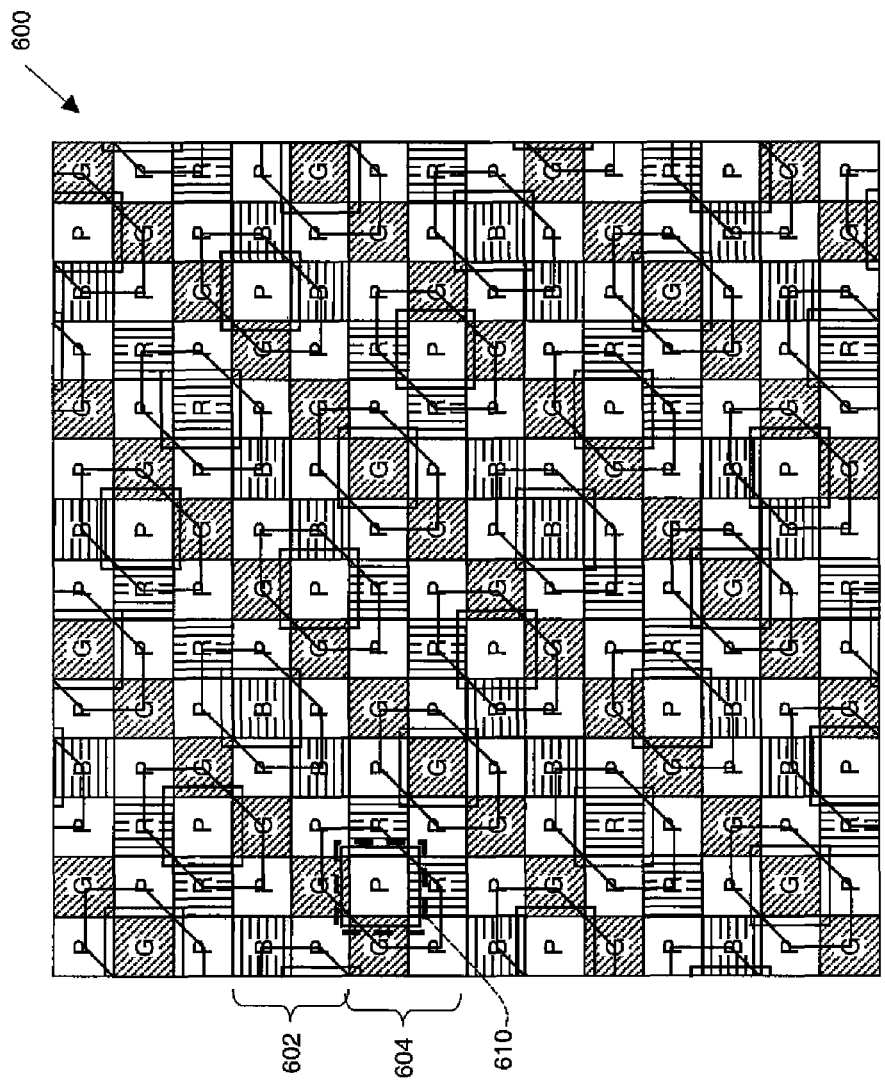

Another example is shown in FIG. 6, where a pixel array 600 has a different panchromatic checkerboard CFA pattern than that used in FIG. 5, and utilizes a six-pixel sharing arrangement rather than the four-pixel sharing arrangement of FIGS. 2 through 5. The array 600 comprises blue/green row pairs 602 which include only blue, green and panchromatic pixels. The blue/green row pairs 602 alternate with red/green row pairs 604 that include only red, green and panchromatic pixels. The minimal repeating unit in the particular CFA pattern used in the FIG. 6 example comprises 16 contiguous pixels and may be viewed as being arranged as follows:

| P | B | P | G |
|---|---|---|---|
| B | P | G | P |
| P | G | P | R |
| G | P | R | P |

Patterns with other minimal repeating units, such as minimal repeating units of at least 12 pixels as described in the above-cited U.S. Patent Application Publication No. 2007/0024931, may be used. Also, colors other than red, green and blue may be used, such as, for example, cyan, magenta and yellow.

A given group of array positions in this example comprises six positions that include photodiodes arranged around a single central dropped pixel position 610 that does not include a photodiode but instead includes a shared diffusion region. The location of the dropped pixel position varies in a regular manner from row to row within the pixel array 600. More specifically, in this example, every eighth pixel position in a given row is a dropped pixel position, and the dropped pixel positions are offset from row to row by two pixel positions. The dropped pixel positions thus also follow a repeating pattern within the array. The six pixels which share a diffusion region in a given dropped pixel position are shown in FIG. 6 as being interconnected with one another. This shared diffusion region is assumed to be coupled to a corresponding region in an underlying circuit wafer via a corresponding inter-wafer interconnect, as in the embodiment of FIGS. 2 to 5.

Figure 7:
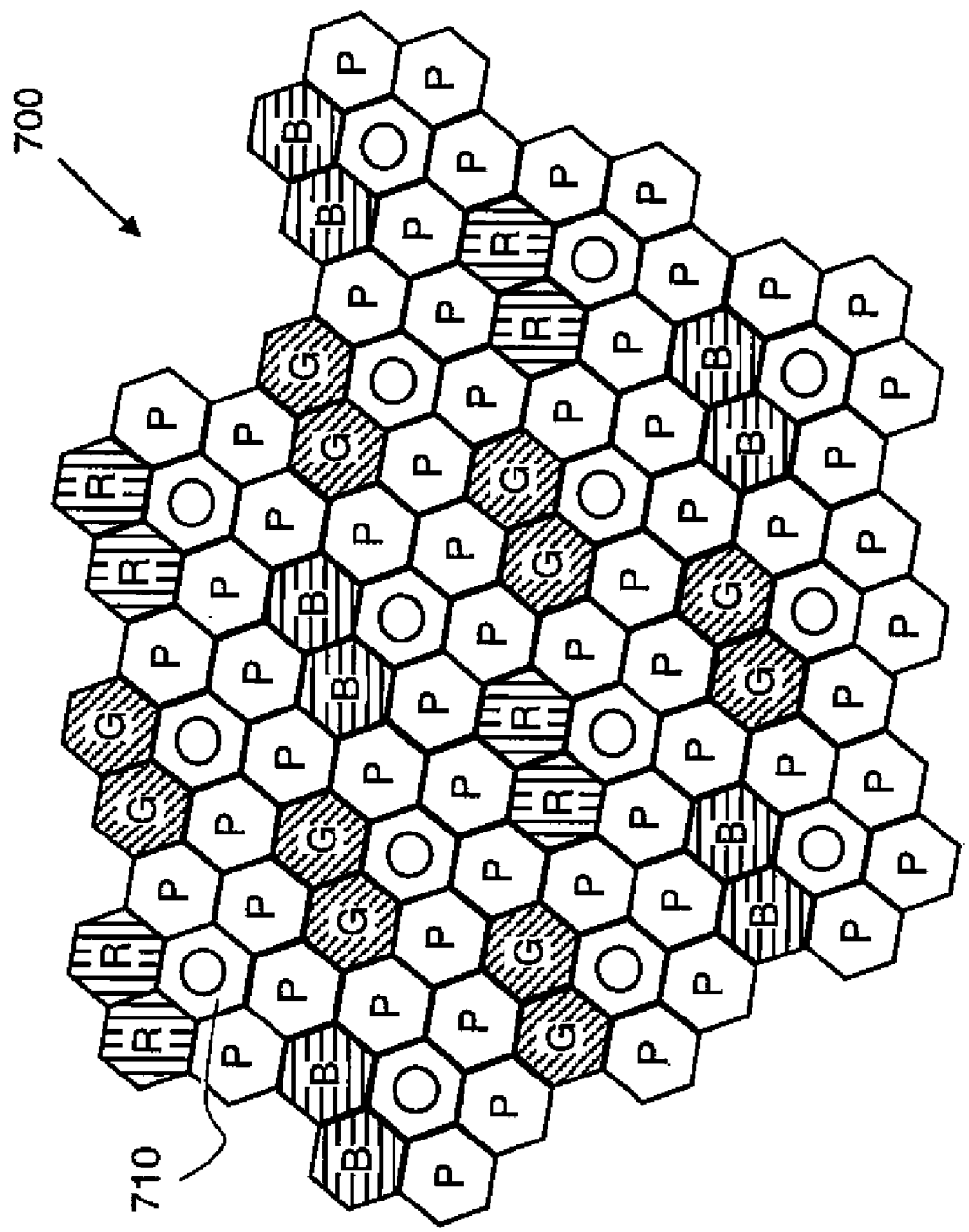

In the embodiments of FIGS. 2 through 6, the pixel array comprises a rectangular array of rows and columns. However, other embodiments of the invention need not utilize a rectangular array. For example, FIG. 7 shows an alternative embodiment in which the pixel array of image sensor 20 is not a rectangular array, but is instead a hexagonal array. In this embodiment, a pixel array 700 again comprises repeating groups of array positions with a given such group comprising multiple positions that include respective photodiodes and are arranged around a single central dropped pixel position that does not include a photodiode but is instead utilized for a diffusion region shared by the surrounding photodiodes. More specifically, each group in this embodiment comprises six positions that include photodiodes and are arranged around a single central dropped pixel position 710 that does not include a photodiode. As in the previous embodiments, each of the photodiodes in the group is coupled via a corresponding transfer gate to a shared diffusion region arranged in the dropped pixel position. Again, this shared diffusion region is assumed to be coupled to a corresponding region in an underlying circuit wafer via a corresponding inter-wafer interconnect, as in the embodiment of FIGS. 2 to 5.

The photodiodes in two adjacent ones of the six positions that include photodiodes comprise same-color photodiodes in accordance with the CFA pattern associated with the image sensor, while the photodiodes in the remaining ones of the six positions comprise panchromatic photodiodes in accordance with the CFA pattern. For example, the uppermost group at the left hand side of the pixel array 700 includes two adjacent red pixels and four panchromatic pixels arranged around the dropped pixel position 710. Other groups of positions in the pixel array are similarly configured to include two adjacent same-color pixels, which may be either red, green or blue, and four adjacent panchromatic pixels, surrounding a dropped pixel position. This particular arrangement facilitates color binning. Also, since each pair of same-color pixels is completely surrounded by panchromatic pixels, CFA interpolation operations can be performed more easily and accurately. Again, the particular CFA pattern and the pixel sharing arrangement may be varied in other embodiments.

It is apparent from the foregoing description that pixel arrays can be classified geometrically as plane tilings by regular polygons. In the examples of FIGS. 2 through 6, the tiling may be viewed as being generated from a single polygon, namely a square, while in the example of FIG. 7 the tiling is also generated from a single polygon, but in this case a hexagon. The corresponding patterns are generally referred to as a square tiling pattern and a hexagonal tiling pattern, respectively. The dropped pixel positions of the pixel array correspond to selected ones of the tiles of the tiling pattern.

Figure 8A:
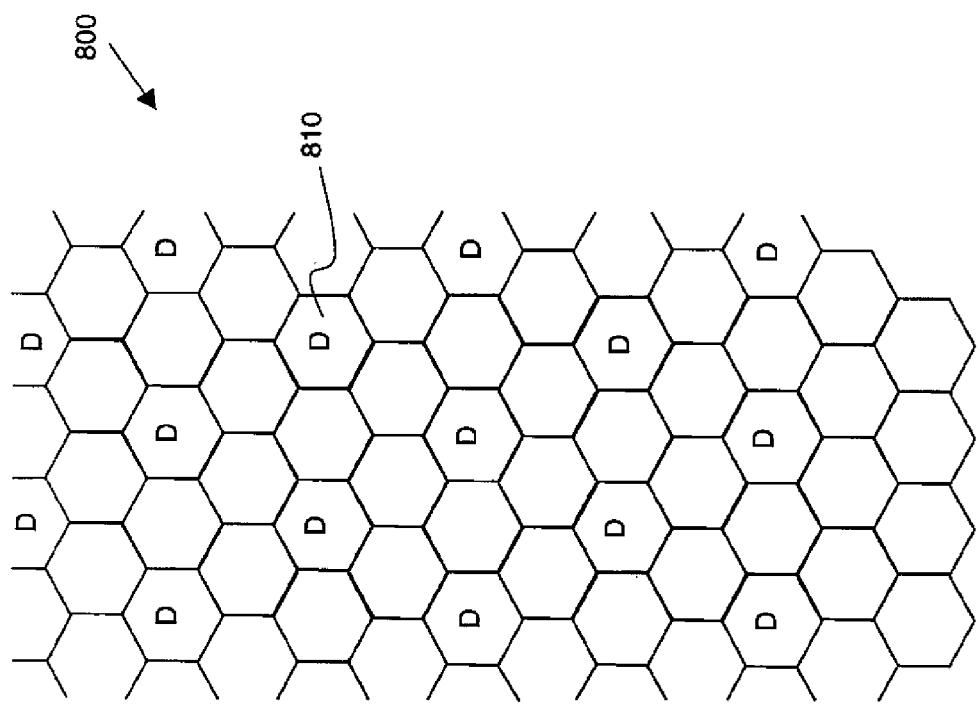
Figure 8B:
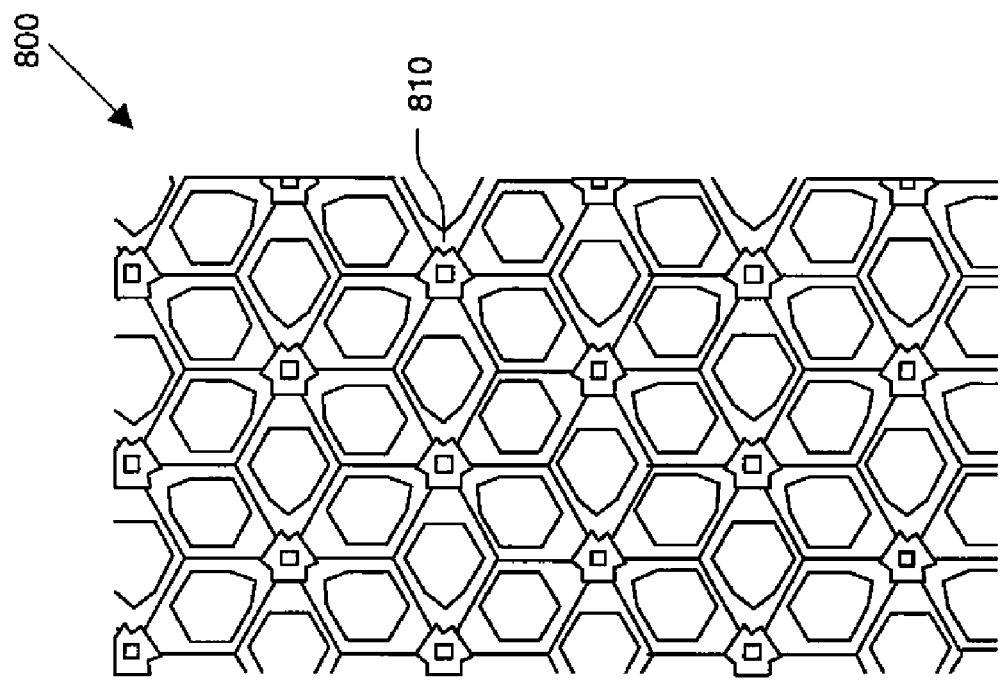
Figure 8C:
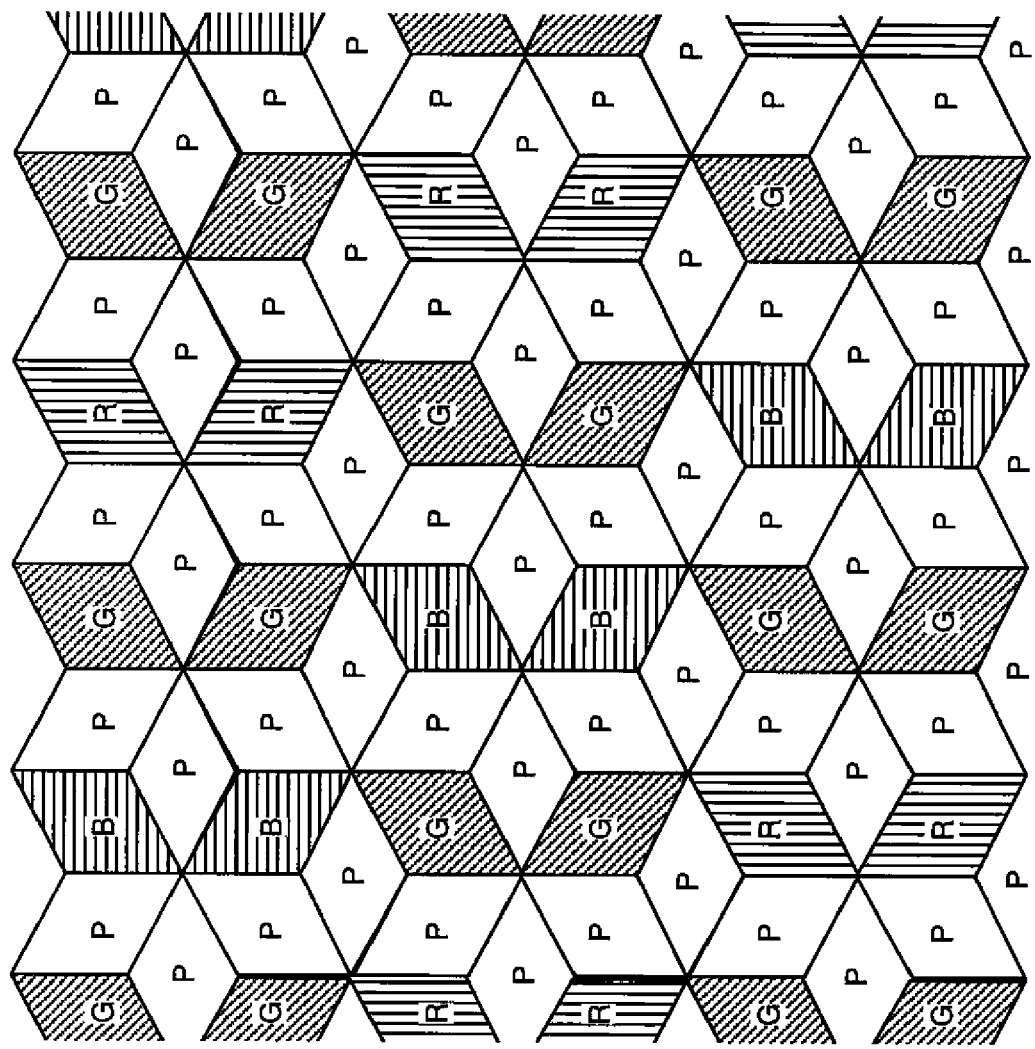

FIG. 8 illustrates another embodiment of the invention. With reference to FIG. 8A, a pixel array 800 having a hexagonal tiling pattern is shown. The dropped pixel positions in this array are denoted by the letter D. Reference numeral 810 denotes a particular one of the dropped pixel positions. In this embodiment, one in four of the hexagons of the hexagonal tiling pattern is identified as a dropped pixel position. FIG. 8B shows a plan view of the pixel array 800, with each dropped pixel position including a floating diffusion region that is shared by photodiodes in three neighboring pixel positions via respective transfer gates. The photodiodes may be viewed as having a quasiregular rhombic tiling. FIG. 8C shows an example of a CFA pattern that may be used for the quasiregular rhombic tiling of FIG. 8B. The red, green and blue color filter elements are grouped in pairs of two same-color elements so that they can be binned for better luminance matching.

Figures 9A, 9B:
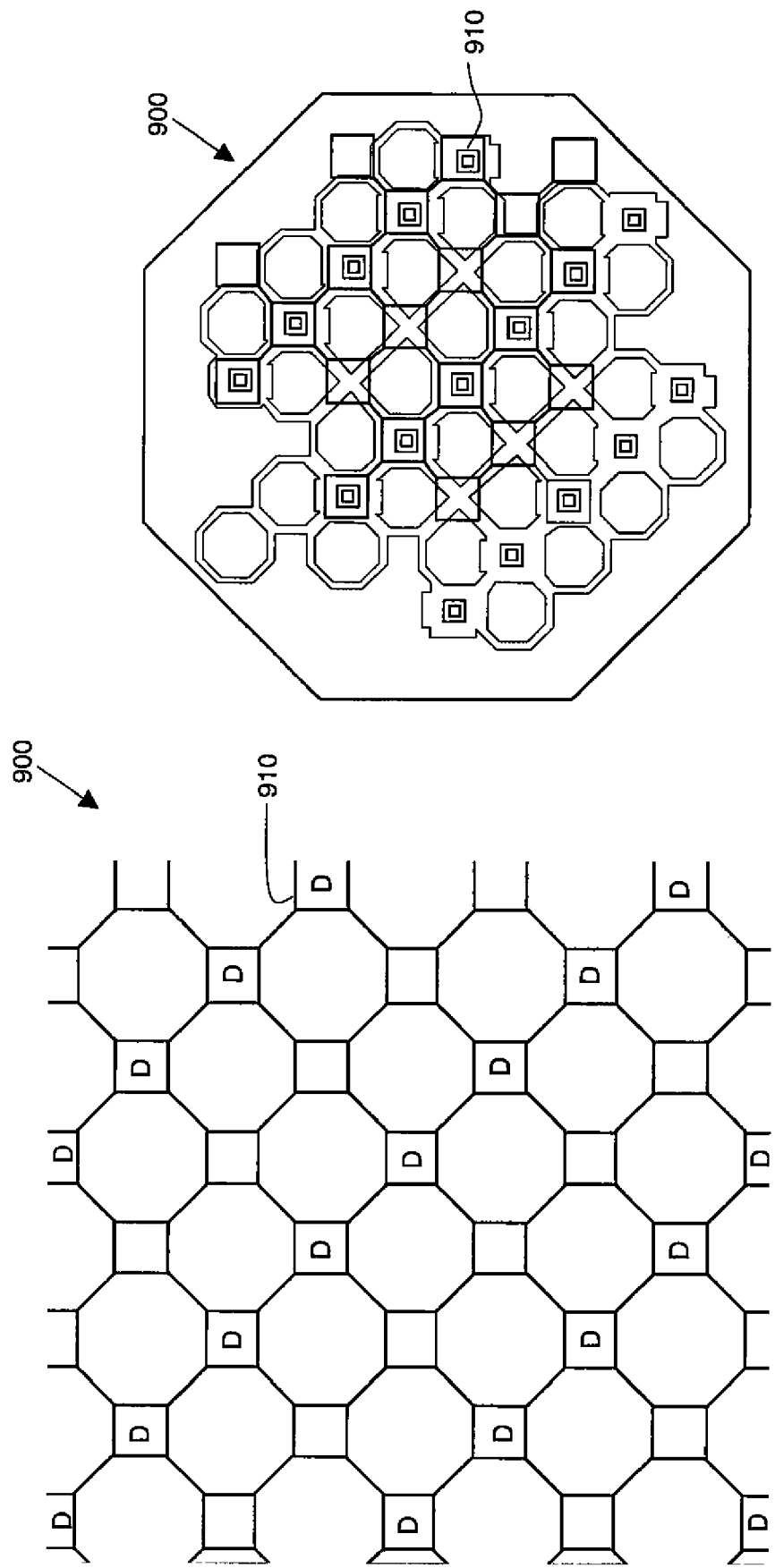

FIG. 9 illustrates yet another embodiment of the invention. The tiling pattern in this embodiment is a type of truncated square tiling pattern, shown generally in FIG. 9A. This truncated square tiling pattern is generated from two polygons, namely, a square and an octagon. The dropped pixel positions in the pixel array 900 are again denoted by the letter D, and generally correspond to half of the square polygons. Reference numeral 910 denotes a particular one of the dropped pixel positions. FIG. 9B shows a plan view of the pixel array 900, with each dropped pixel position including a floating diffusion region that is shared by photodiodes in two neighboring pixel positions via respective transfer gates.

Of course, numerous other tiling arrangements may be used in implementing an image sensor in accordance with the invention. Other examples include rows with square unit cells, rows with rectangular unit cells, trihexagonal tiling, snub hexagonal tiling, prismatic pentagonal tiling, Cairo pentagonal tiling, truncated hexagonal tiling, snub square tiling, floret pentagonal tiling, etc. Those skilled in the art will recognize that the disclosed techniques can be adapted in a straightforward manner to these and other types of pixel arrays.

Advantageously, the illustrative embodiments facilitate the interconnection of sensor and circuit wafers in a stacked image sensor, thereby reducing sensor cost and complexity. These embodiments leverage the advantages of sparse CFA patterns for increased low light sensitivity. Moreover, by configuring the dropped pixel positions in a regular repeating pattern, subsequent image processing operations are simplified.

The invention has been described in detail with particular reference to certain illustrative embodiments thereof, but it will be understood that variations and modifications can be effected within the scope of the invention as set forth in the appended claims. For example, the particular configuration of an image capture device, including its image sensor and associated dropped pixel positions and pixel sharing arrangement, can be varied in alternative embodiments. Also, features such as the particular types of CFA patterns that are used, the configuration of the pixel array and its associated elements, and the configuration of the shared diffusion regions, inter-wafer interconnects and associated circuitry, may be altered in other embodiments to accommodate the needs of other image capture devices and operating modes. These and other alternative embodiments will be readily apparent to those skilled in the art.

PARTS LIST 10 light from subject scene
11 imaging stage
12 lens
13 neutral density filter
14 iris
18 shutter
20 image sensor
22 analog signal processor
24 analog to digital (A/D) converter
26 timing generator
28 image sensor stage
30 digital signal processor (DSP) bus
32 digital signal processor (DSP) memory
36 digital signal processor (DSP)
38 processing stage
40 exposure controller
42 brightness sensor
50 system controller
52 bus
54 program memory
56 system memory
57 host interface
60 memory card interface
62 memory card socket
64 memory card
65 image display
68 user control and status interface
70 viewfinder display
72 exposure display
74 user inputs
76 status display
80 video encoder
82 display controller
100 pixel array
102 photodiode
103 shared diffusion region
104 inter-wafer interconnect
105 color filter array (CFA) pattern
106 sensor wafer
108 circuit wafer
112 floating diffusion
114 sensor wafer conductor
115 circuit wafer conductor
116 floating diffusion
120 reset gate (RG)
122 source follower (SF)
124 row select (RSEL)
128 output voltage signal line
130 silicon portion of sensor wafer
132 silicon portion of circuit wafer
140 metallization portion of sensor wafer
142 metallization portion of circuit wafer
150 dropped pixel position
600 pixel array
602 blue/green row pair
604 red/green row pair
610 dropped pixel position
700 pixel array
710 dropped pixel position
800 pixel array
810 dropped pixel position
900 pixel array
910 dropped pixel position

The invention claimed is:

1. An image sensor comprising:

a sensor wafer comprising a plurality of photosensitive elements arranged in a two-dimensional array of positions in which a subset of the array positions do not include photosensitive elements but instead include floating diffusion regions each of which is shared by two or more of the photosensitive elements; and a circuit wafer underlying the sensor wafer, wherein the circuit wafer includes a plurality of floating diffusion regions;

wherein the sensor wafer is interconnected with the circuit wafer utilizing a plurality of inter-wafer interconnects each coupled to a respective one of the floating diffusion regions on the circuit wafer and a respective one of the shared floating diffusion regions on the sensor wafer.

2. The image sensor of claim 1 wherein the circuit wafer comprises a plurality of sets of circuitry for processing signals generated by the photosensitive elements with each of said sets being associated with a corresponding one of the inter-wafer interconnects and shared by two or more of the photosensitive elements.

3. The image sensor of claim 1 wherein the array positions that do not include photosensitive elements correspond to respective designated elements of a color filter array pattern of the image sensor.

4. The image sensor of claim 1 wherein the two-dimensional array comprises repeating groups of multiple positions with a given such group comprising a plurality of positions that include photosensitive elements arranged around a central position that does not include a photosensitive element.

5. The image sensor of claim 4 wherein a given one of the shared floating diffusion regions is arranged in the central position of the given group and is shared by the photosensitive elements in each of at least a subset of the positions arranged around that central position.

6. The image sensor of claim 5 wherein the array of positions comprises a rectangular array of rows and columns of positions.

7. The image sensor of claim 6 wherein the given group comprises four positions that include photosensitive elements and are arranged around a single central position that does not include a photosensitive element but instead includes one of the shared floating diffusion regions.

8. The image sensor of claim 7 wherein the photosensitive elements in the four positions that include photosensitive elements correspond to panchromatic elements in a color filter array pattern of the image sensor.

9. The image sensor of claim 7 wherein photosensitive elements in two of the four positions that include photosensitive elements comprise photosensitive elements corresponding to a first color of a color filter array pattern of the image sensor and the photosensitive elements in the remaining two of the four positions comprise photosensitive elements corresponding to a second color of the color filter array pattern.

10. The image sensor of claim 6 wherein the given group comprises six positions that include photosensitive elements and are arranged around a single central position that does not include a photosensitive element but instead includes one of the shared floating diffusion regions.

11. The image sensor of claim 5 wherein the array of positions comprises a hexagonal array of positions.

12. The image sensor of claim 11 wherein the given group comprises six positions that include photosensitive elements and are arranged around a single central position that does not include a photosensitive element but instead includes one of the shared floating diffusion regions.

13. The image sensor of claim 12 wherein photosensitive elements in two adjacent ones of the six positions that include photosensitive elements correspond to same-color elements in a color filter array pattern of the image sensor while the photosensitive elements in the remaining ones of the six positions correspond to panchromatic elements in the color filter array pattern.

14. The image sensor of claim 11 wherein the given group comprises three positions that include photosensitive elements and are arranged around a single central position that does not include a photosensitive element but instead includes one of the shared floating diffusion regions.

15. The image sensor of claim 1 wherein each of the photosensitive elements that shares a given one of the shared floating diffusion regions is coupled to that shared floating diffusion region via a corresponding transfer gate of the sensor wafer.

16. The image sensor of claim 1 wherein said array positions are arranged in accordance with a truncated square tiling pattern comprising squares and octagons and wherein particular ones of the array positions corresponding to a designated subset of the squares do not include photosensitive elements but instead include respective ones of the shared floating diffusion regions.

17. The image sensor of claim 1 wherein one or more of the array positions that do not include photosensitive elements have respective black filter elements associated therewith in a color filter array pattern of the image sensor.

18. The image sensor of claim 1 wherein one or more of the array positions that do not include photosensitive elements are at least partially covered by adjacent extended color filter elements in a color filter array pattern of the image sensor.

19. The image sensor of claim 1 wherein said image sensor comprises a CMOS image sensor.

20. A method comprising the steps of:
providing a sensor wafer comprising a plurality of photosensitive elements arranged in a two-dimensional array of positions in which a subset of the array positions do not include photosensitive elements but instead include floating diffusion regions each of which is shared by two or more of the photosensitive elements;
providing a circuit wafer underlying the sensor wafer, wherein the circuit wafer includes a plurality of floating diffusion regions; and
interconnecting the sensor wafer with the circuit wafer utilizing a plurality of inter-wafer interconnects each coupled to a respective one of the floating diffusion regions on the circuit wafer and a respective one of the shared floating diffusion regions on the sensor wafer.

21. An image capture device comprising:
an image sensor; and
one or more processing elements configured to process outputs of the image sensor to generate a digital image;
wherein said image sensor comprises:
a sensor wafer comprising a plurality of photosensitive elements arranged in a two-dimensional array of positions in which a subset of the array positions do not include photosensitive elements but instead include floating diffusion regions each of which is shared by two or more of the photosensitive elements; and
a circuit wafer underlying the sensor wafer, wherein the circuit wafer includes a plurality of floating diffusion regions;
wherein the sensor wafer is interconnected with the circuit wafer utilizing a plurality of inter-wafer interconnects each coupled to a respective one of the floating diffusion regions on the circuit wafer and a respective one of the shared floating diffusion regions on the sensor wafer.

22. The image capture device of claim 21 wherein said image capture device comprises a digital camera.

* * * * *